United States Patent
McClellan et al.

(10) Patent No.: US 7,404,133 B2
(45) Date of Patent: Jul. 22, 2008

(54) ERROR DETECTION AND CORRECTION EMPLOYING MODULATION SYMBOLS SATISFYING PREDETERMINED CRITERIA

(75) Inventors: Paul J. McClellan, Bend, OR (US); Darwin M. Hanks, Loveland, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 405 days.

(21) Appl. No.: 11/013,573

(22) Filed: Dec. 15, 2004

(65) Prior Publication Data

US 2006/0156175 A1  Jul. 13, 2006

(51) Int. Cl.
*H03L 1/14* (2006.01)

(52) U.S. Cl. .................................................. 714/750

(58) Field of Classification Search .............. 341/59, 341/58, 67, 81, 50; 714/750
See application file for complete search history.

(56) References Cited

U.S. PATENT DOCUMENTS

| | | | | |
|---|---|---|---|---|
| 4,486,739 A * | 12/1984 | Franaszek et al. | ............. | 341/59 |
| 5,623,507 A | 4/1997 | Burns et al. | | |
| 5,663,724 A * | 9/1997 | Westby | ........................ | 341/59 |
| 6,029,266 A | 2/2000 | Lee | | |
| 6,072,410 A * | 6/2000 | Kim | ............................ | 341/81 |
| 6,140,947 A | 10/2000 | Livingston | | |
| 6,184,806 B1 * | 2/2001 | Patapoutian et al. | .......... | 341/59 |
| 6,241,778 B1 * | 6/2001 | de Lind van Wijngaarden et al. | ........................... | 341/58 |
| 6,295,010 B1 * | 9/2001 | Thiesfeld | ..................... | 341/58 |
| 6,476,737 B1 * | 11/2002 | Caroselli et al. | .............. | 341/59 |
| 6,617,984 B1 * | 9/2003 | Kryzak et al. | ................. | 341/59 |
| 6,751,766 B2 | 6/2004 | Guterman et al. | | |
| 6,772,384 B1 | 8/2004 | Noguchi | | |
| 6,914,545 B1 * | 7/2005 | Zaidi | ........................... | 341/59 |
| 6,933,865 B1 * | 8/2005 | Kuznetsov et al. | ............ | 341/59 |
| 7,006,019 B2 * | 2/2006 | Lee et al. | ...................... | 341/59 |
| 7,064,683 B1 * | 6/2006 | Westby | ........................ | 341/50 |
| 2001/0023495 A1 | 9/2001 | Chang et al. | | |
| 2002/0010888 A1 | 1/2002 | Kwon | | |
| 2006/0125666 A1 * | 6/2006 | Hanks | ........................ | 341/143 |

FOREIGN PATENT DOCUMENTS

EP  0592229  4/1994
GB  1540617  2/1979

OTHER PUBLICATIONS

Chien-Chan Liang: "Improvement of Performance in Digital Recording with Distanced Modulation Code", IEEE Trans. Consumer Electronics, vol. 39, No. 4, Nov. 1, 1993, pp. 740-744.
McGregor M S, Watson J C : "Implementing the Reed-Solomon Code: A Case Study", IEEE Colloquium On Signal Processing Applications of Finite Field Mathematics, Jun. 1, 1989, 7 pgs.
International Search Report dated Mar. 27, 2006.

* cited by examiner

*Primary Examiner*—Jacques Louis-Jacques
*Assistant Examiner*—Sam Rizk (57) ABSTRACT

A method for error detection and correction comprising performing a first modulation error scan of said modulation symbol, marking data that fails to comply with a predetermined criteria, demodulating said modulation symbols, computing a first error syndrome using said demodulated symbols, and correcting errors using said error syndrome computation.

28 Claims, 4 Drawing Sheets

ERROR DETECTION AND CORRECTION EMPLOYING MODULATION SYMBOLS SATISFYING PREDETERMINED CRITERIA

RELATED APPLICATION

The present invention claims priority to a provisional application, by the same inventors and entitled "Error Correction Technique" Ser. No. 60/635,637 filed on Dec. 12, 2004.

BACKGROUND

Numerous applications utilize digital data storage and transmission for data communication, such as sending information via internet web sites or storing information on compact discs. Digital transmission systems or digital data storage systems typically use a sequence of binary information, either delivered to a receiver across a transmission channel or stored to a medium (e.g., CDROM). However, the binary information may become corrupted during storage or transmission, which could impair the accuracy of the information.

As a result, error control coding is often applied to the transmitted or stored data. Techniques known as forward error correction schemes have been developed to improve the reliability of the data communicated in digital applications. Forward error correction schemes are error control techniques that can detect and correct corrupt data without requiring the transmitter to re-send the information. An example of such a scheme is the Reed-Solomon code.

Many forward error correction schemes, such as the Reed-Solomon code, typically encode a group of data symbols into blocks of a predetermined size. For each block, an additional number of "parity" symbols are computed and added. The resulting augmented block is typically referred to as a "codeword." Following transmission, or following reading of the stored data, a decoding technique is applied to the codeword to correct for errors that occurred during storage or transmission to thus restore the original data.

While such techniques have improved the reliability of transmitted digital data, further improvement is desireable. Despite the use of current error correction techniques, undetected errors may still occur, or errors may be detected but not properly corrected. This results in data that is less reliable than desired.

BRIEF DESCRIPTION OF THE DRAWINGS

For the purpose of illustrating the invention, there is shown in the drawings one exemplary implementation; however, it is understood that this invention is not limited to the precise arrangements and instrumentalities shown.

DETAILED DESCRIPTION

Overview

Various types of systems utilize digital data storage or transfer to communicate information. One exemplary system that employs digital data transfer is the LightScribe® Media Identification System (hereinafter "the LightScribe system") produced by Hewlett-Packard (Palo Alto, Calif.). The exemplary embodiment of the invention described herein shall be described with reference to its use in conjunction with the LightScribe system; however, it is understood that the invention could be used on other systems that uses digital data storage or transfer.

In an encoding process, a sequence of information in binary form is initially partitioned into error control coding (ECC) symbols. In the exemplary implementation, each ECC symbol comprises seven data bits. Eleven ECC symbols containing message data are combined with four ECC parity symbols to form a fifteen-symbol codeword. Each individual seven-bit ECC symbol within the codeword is then modulated using a seven-to-eight bit modulation scheme to create a modulation symbol that is 8 bits in length. A fifteen-symbol modulation codeword is thus created from the fifteen-symbol ECC codeword. The details of one useable modulation scheme employed in the LightScribe system is further described in a U.S. patent application entitled "Data Modulation" filed on Dec. 14, 2004 and is fully incorporated herein by reference.

Typically, existing error correction techniques have been used to perform forward error correction on received codewords to correct for bit errors which may occur in transmission or storage. However, existing techniques fail to adequately address certain conditions. First, existing error correction techniques may fail to detect a particular error pattern. This type of failure is referred to as a "missed detection" event. Second, an error correction scheme may detect the existence of an error, and thus apply a correction, but fail to accurately correct the data to reflect the original data. This type of failure is referred to as a "false correction" event.

Missed detection events and false correction events reduce the overall reliability of the forward error correction process. The occurrence of these events is significantly reduced by the error correction scheme in accordance with an exemplary implementation of the present invention.

Error Correction Technique

Figure 1A:
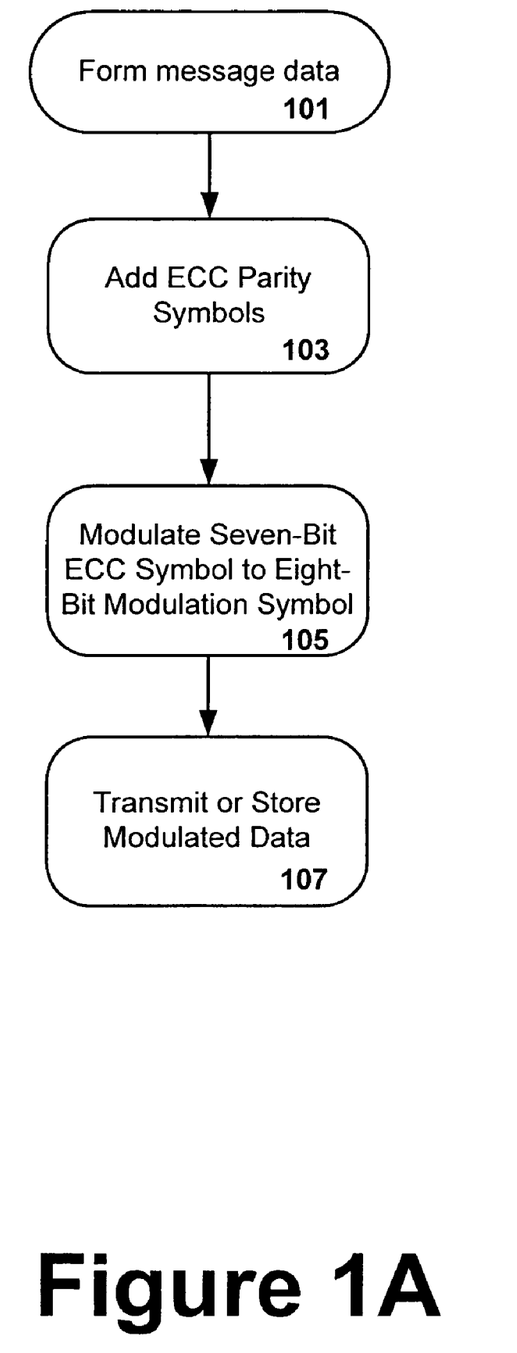
FIG. 1A is a flow chart illustrating an exemplary implementation of the encoding process of present invention.

FIG. 1A is a flow chart illustrating one embodiment of the steps involved in performing the encoding in accordance with the present invention. Alternatively, the flow chart of FIG. 1A may be viewed as describing the operation of a system configured to practice an embodiment of the present invention. The original raw digital data comprises a series of binary digits, or bits. In the exemplary implementation of the encoding process, these bits are divided into groups of seven, forming seven-bit ECC symbols. A sequence of seven-bit ECC symbols representing the original data constitutes the message data (step 101).

In the forward error control encoding process, additional ECC parity symbols are computed and added to the message data to form the ECC codeword data (step 103). These additional ECC parity symbols provide redundancy that is used by a corresponding error detection and correction process performed on received data to detect and correct for errors that occur during storage or transmission of the data.

In the modulation process, the seven-bit ECC symbols of the ECC codeword are modulated to create eight-bit modulation symbols using a seven-to-eight modulation technique (step 105). The modulation technique employed in the exemplary embodiment results in each valid modulation symbol containing no fewer than three "1" bits and three "0" bits. The seven-to-eight modulation technique used in the exemplary embodiment is a codebook modulation technique. Each seven-bit ECC symbol is assigned to a valid modulation symbol obtained from the codebook for the seven-to-eight bit modulation.

Figure 2:
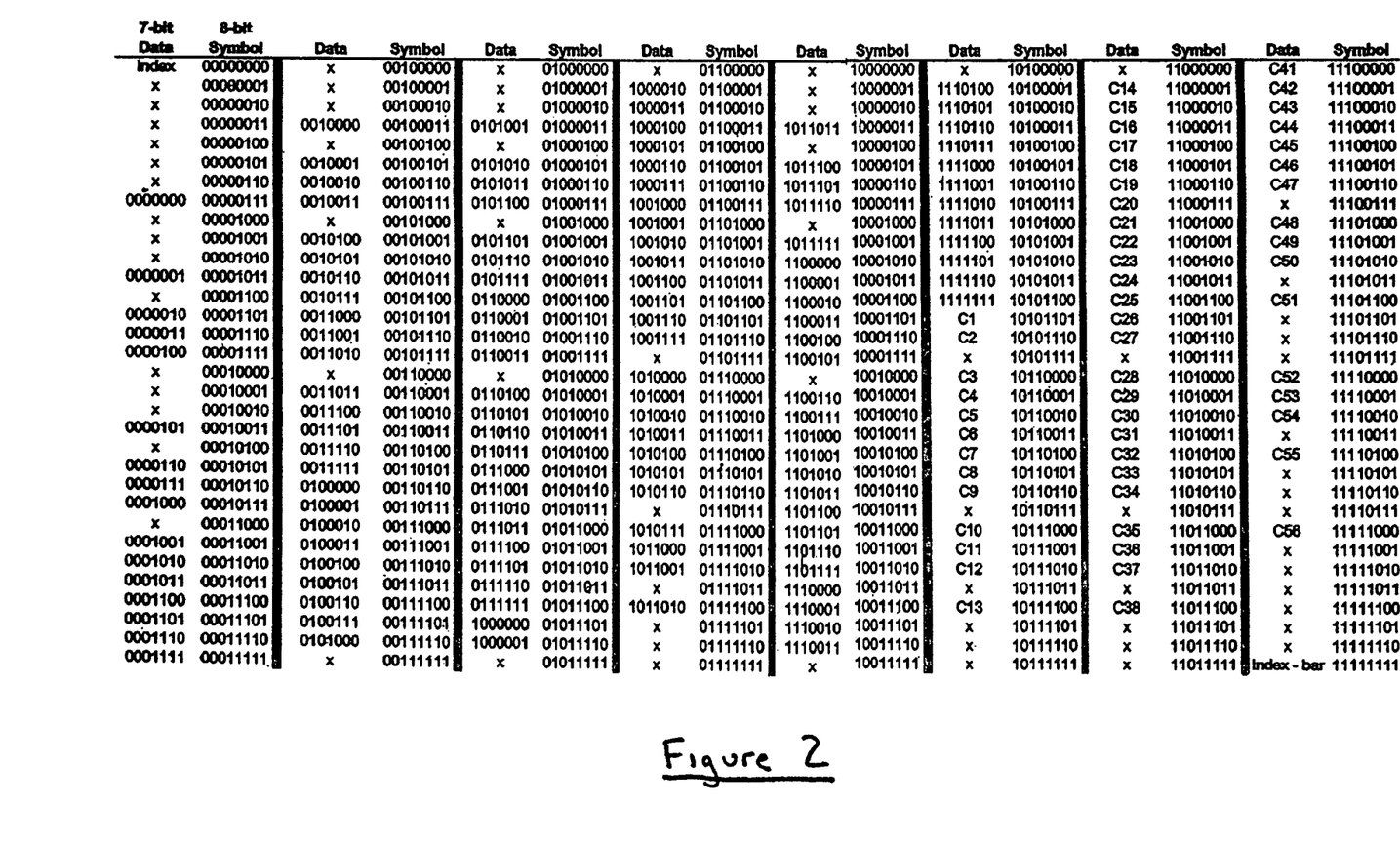
FIG. 2 is a table illustrating the codebook of an exemplary modulation scheme used in an exemplary implementation the present invention.

Referring to FIG. 2, a table illustrating an exemplary seven-to-eight bit modulation codebook is shown. Column 1("Data") lists the possible unmodulated seven-bit ECC symbols. Column 2("Symbol") lists the corresponding modulation symbols assigned to each possible seven-bit ECC symbol. Modulation symbols that contain fewer than three binary "1" bits of the eight possible bits are deemed to be invalid, and thus are not used as a valid modulation symbol for a seven-bit ECC symbol. Modulation symbols that contain fewer than three binary "0" bits of the eight possible bits are deemed to be invalid, and thus are also not used as a modulation symbol for a seven-bit ECC symbol. Using such a codebook, the resulting modulation symbols have a "3-to-5" bit condition, meaning that each valid modulation symbol contains between three and five "1" bits and between three and five "0" bits.

In the exemplary embodiment, each seven-bit ECC symbol is assigned in numerical order to a valid modulation symbol (i.e., an eight-bit modulation symbol that meets the 3-to-5 condition) to perform the modulation process. For example, referring to FIG. 2, the first ECC symbol comprising "0000000" is assigned to the first valid modulation symbol, which is "00000111." The first seven eight-bit modulation symbols (00000000, 00000001, 00000010, 00000011, 00000100, 00000101, and 00000110) are skipped, as these modulation symbols are deemed to be invalid for failing to meet the "3-to-5" condition. The next three eight-bit modulation symbols are also skipped (00001000, 00001001, 00001010) for the same reason, with the next seven-bit ECC symbol (0000001) being assigned to the next valid eight-bit modulation symbol (00001011). This process is repeated until all possible seven-bit ECC symbols have been assigned to a corresponding eight-bit modulation symbol.

After all possible seven-bit ECC symbols have been assigned, there are several valid eight-bit modulation symbols remaining that have not been matched with a seven-bit block. These remaining modulation symbols may be used for various purposes (e.g., as control words, etc.), but they are not required to implement the exemplary embodiment of the error correction technique, and thus shall not be addressed herein.

The sequence of eight-bit modulation symbols forms a signal that may be stored or transmitted (step 109). Upon receipt of the stored or transmitted signal, the encoding process is reversed in a decoding process, as shown in FIG. 1B and discussed below.

Figure 1B:
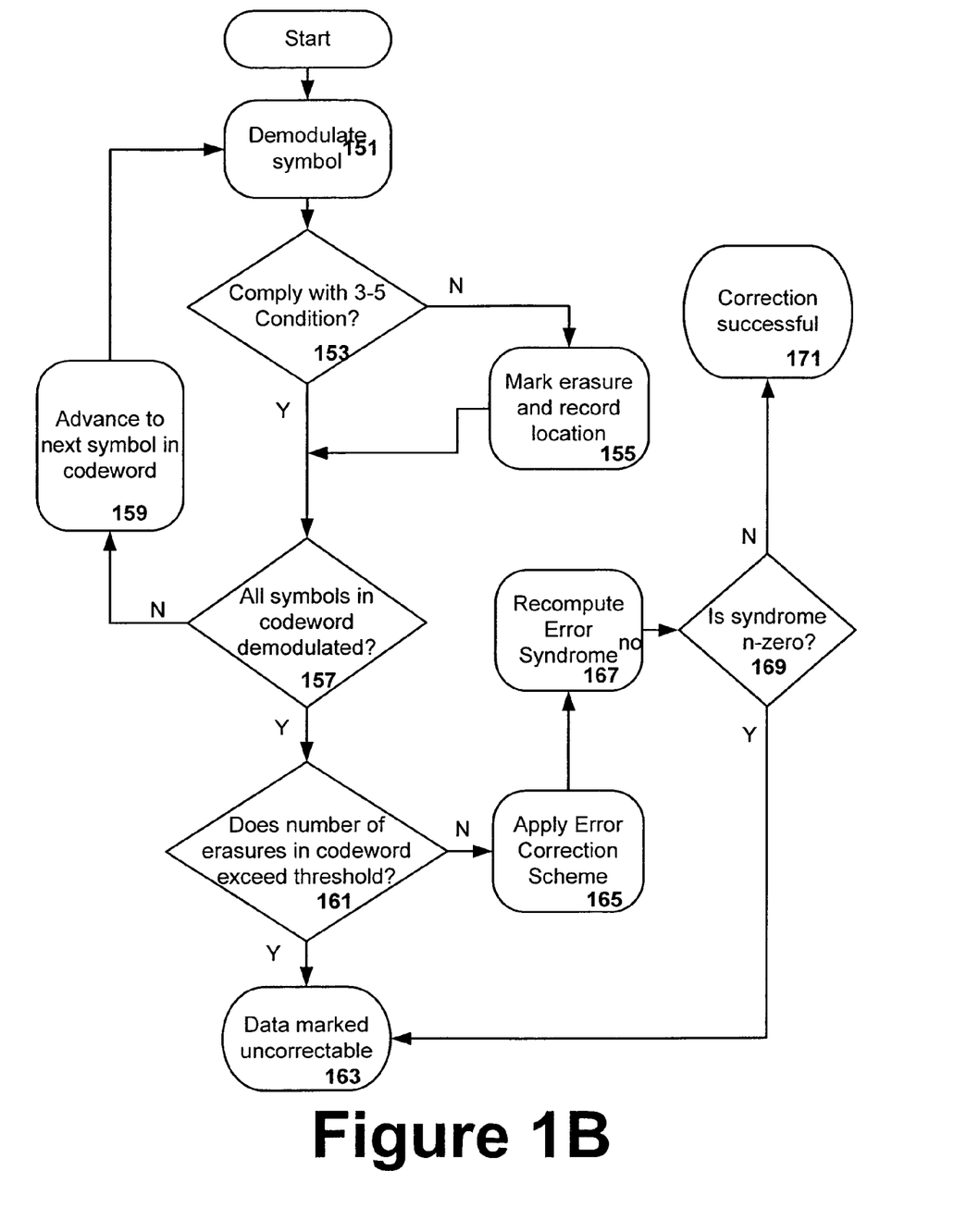
FIG. 1B is a flow chart illustrating an exemplary implementation of the decoding process of the present invention.

Referring to FIG. 1B, in the decoding process each modulation symbol contained in the fifteen symbol codeword is subjected to a demodulation process (step 151). Typically, this demodulation process is performed upon the modulation symbols following reading from a storage medium or transmission over a transmission channel. However, the storage or transmission of the modulated symbols is not pertinent to the error correction technique of the present invention, and thus shall not be discussed in detail herein.

The demodulation process reverses the modulation process described above. Each modulation symbol is mapped to an ECC symbol. During the demodulation process, a check is conducted to determine if any modulation symbol contains fewer than three or more than five of either a binary "1" bit or a binary "0" bit (step 153). Because the parameters of the seven-to-eight bit modulation requires the 3-5 condition as described above, any modulation symbols that fail to conform to the 3-5 condition are marked as containing symbol erasures (i.e., bit errors in the modulation symbol) at this point (step 155). This marking of symbol erasures consists of recording the location of the symbol erasure in the codeword and, since we do not have an ECC symbol associated with the modulation symbol erasure, the assignment of the ECC symbol "0" (all seven bits zero) at that codeword location. The number and locations of symbol erasures are thereby noted to indicate errors in the modulation symbols.

The demodulation process is conducted for each modulated symbol contained in a codeword. That is, after demodulating a symbol and marking any erasures, a check is performed to determine if there are remaining symbols in the codeword (step 157), and if so, the next symbol is selected to be demodulated (step 159).

Some storage or transmission errors may cause bit errors in a modulation symbol that do not result in the modulation symbol being flagged as an erasure. Therefore, the erasure check does not reliably detect all storage or transmission errors. Consequently, performing forward error correction using erasure ECC symbols may still result in a false correction event, which would decrease the reliability of the data. If performing the error correction process on data that is more likely to result in false correction events can be avoided, the occurrence of false correction events will be reduced and thus the data reliability will be improved.

The exemplary embodiment of the error correction method determines the location and magnitude of symbol errors through a search procedure. If the location of a symbol error is known a priori, as is the case with a detected modulation error, the error correction method utilizes less information in computing the symbol correction at that location than would have been used to both detect the symbol error location and to compute the symbol error correction at that location. Since not all symbol errors may be detected in the demodulation process, by recording the location of those symbol errors that are detected in the demodulation process and providing those locations to the error correction method, increased performance of the error correction method is obtained.

The demodulation process results in retrieving an ECC codeword comprising seven-bit ECC symbols. The number of modulation errors detected in the demodulation process serves as an estimate of the total error rate in the stored or transmitted data, including errors not detected in the demodulation process. Once all symbols in a codeword have been demodulated, a determination is made to decide if error correction is to be applied. If the demodulation process detects a number of modulation errors that exceeds a specified threshold (step 161), the decoding process is terminated (step 163). By avoiding applying the forward error correction method when the number of modulation errors exceeds a threshold, the risk of false corrections that exists in the presence of a high error rate is reduced. In the exemplary embodiment, this threshold is the number of errors the forward error correction scheme could correct without any other error detection process. The exemplary embodiment uses a Reed-Solomon code. Reed-Solomon codes typically can correct for errors when the number of errors is fewer than the number of parity symbols divided by two. For the exemplary Reed-Solomon (15,11) code, the modulation threshold is two (i.e., four parity symbols divided by two equals two). Therefore, if the number of modulation errors exceeds two, the decoding process is terminated and a decoding failure is noted.

A forward error correction scheme is applied using the demodulated ECC codeword and the number and location of detected modulation errors (step 165). In the exemplary embodiment, a Reed-Solomon (15,11) forward error correction scheme using seven-bit symbols is applied. However, other error correction techniques could also be used such other Bose, Chaudhuri, and Hocquenghem (BCH) codes or other cyclic linear block codes (e.g., Hamming codes). The operation of such codes are well known in the art.

Following the application of the Reed-Solomon (15,11) code, further reduction of possible false correction events is achieved by performing a second screening process on the data. To further filter out false correction events, the error syndrome is recomputed (step 167) The error correction process is not considered to be successful if the recomputed error syndrome after data correction is non-zero, which would indicate the presence of additional errors (step 169). By adding an error correction syndrome recomputation process following the application of the error correction syndrome, additional instances of false correction events are identified. If such a recomputed error syndrome is nonzero, the decoding process is terminated (step 163). If the recomputed error syndrome is zero, the correction is deemed successful (step 171).

Figure 3:
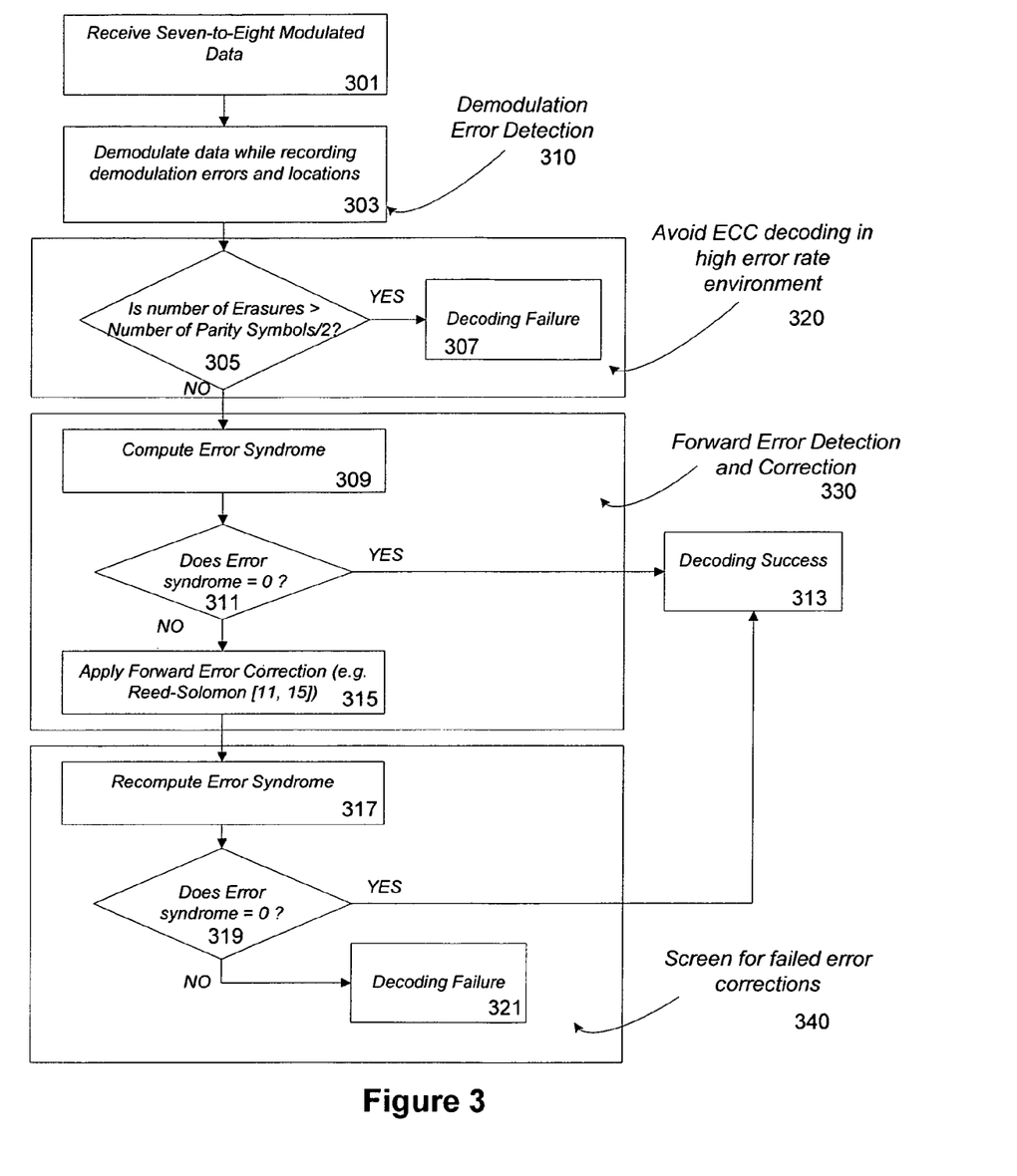
FIG. 3 is a flow chart illustrating a second exemplary implementation of the present invention.

FIG. 3 is a flow chart illustrating the decoding process of the exemplary embodiment of the present invention. Alternatively, the flow chart of FIG. 3 may be viewed as describing the operation of a system configured to practice an embodiment of the present invention. Initially, the ECC symbols are modulated to obtain seven-to-eight modulated symbols, which may be transmitted to a reciever (301). Using the Reed-Solomon error correction scheme described above, four parity symbols are used in a fifteen symbol ECC codeword.

During demodulation of the data, the first error detection process is performed (step 303). A comparison is made to determine if the number of modulation errors exceeds a predetermined threshold equal, for example, to the number of parity symbols divided by two (step 305). In the exemplary embodiment, a Reed-Solomon (15,11) code is used. This code uses four parity bits, so the number of parity bits divided by two is equal to two. If, during demodulation, more than two errors or erasures are found, the symbol is deemed uncorrectable (step 307).

If the number of modulation errors does not exceed the predetermined threshold, then an error syndrome is computed (step 309). A determination is made to see if the computed error syndrome is equal to zero (step 311). If it is, the data is determined to be successfully decoded (step 313). However, if the computed error syndrome is non-zero, errors likely exist in the data. Error correction is applied to the data (step 315). After correction, the error syndrome is recomputed (step 317). If the syndrome now returns a zero result, the data is determined to be successfully decoded (step 313). If the syndrome yields a non-zero result, the data is deemed uncorrectable (step 321).

FIG. 3 illustrates that the error detection and correction scheme in accordance with the present invention reduces the occurrence of false error corrections by combining a demodulation error detection process with a forward error detection and correction process, while avoiding attempts to correct data when the error rates are high. The invention combines a demodulation process 310 (comprising steps 301 and 303) with a first determination of whether the error environment is higher than desired for reliable error correction 320 (comprising steps 305 and 307). A forward error detection and correction stage is then performed 330 (comprising steps 309, 311, and 315). Following error correction, an additional screening process further identifies false error corrections 340 (comprising steps 317, 319, and 321). By combining these processes, the amount of false correction events is significantly reduced.

A variety of modifications to the embodiments described will be apparent to those skilled in the art from the disclosure provided herein. Thus, the present invention may be embodied in other specific forms without departing from the spirit or essential attributes thereof and, accordingly, reference should be made to the appended claims, rather than to the foregoing specification, as indicating the scope of the invention.

What is claimed is:

1. A method for error detection and correction using an error detection and correction process comprising:
    grouping a plurality of data bits into a plurality of error control coding (ECC) symbols;
    modulating said ECC symbols into a plurality of modulation symbols such that a first predetermined criteria is satisfied for each modulation symbol, the first predetermined criteria specifying that each modulation symbol includes between x and y binary (1) bits in total and between x and y binary (1) bits in total, wherein modulating said ECC symbols into the modulation symbols comprises:
    ordering the ECC symbols in numerical order from a lowest ECC symbol to a highest ECC symbol;
    ordering the modulation symbols in numerical order from a lowest modulation symbol to a highest modulation symbol, each modulation symbol satisfying the first predetermined criteria;
    setting a current ECC symbol to the lowest ECC symbol and setting a current modulation symbol to the lowest modulation symbol;
    as a predefined entry point of the method, assigning the current ECC symbol to the current modulation symbol;
    where the current ECC symbol is not the highest ECC symbol,
        advancing the current ECC symbol to a next ECC symbol within the numerical order in which the ECC symbols have been ordered;
        advancing the current modulation symbol to a next modulation symbol within the numerical order in which the modulation symbols have been ordered;
        repeating the method at the predefined entry point;
    combining a sub-plurality of modulation symbols with at least one parity symbol to form a codeword;
    performing a first modulation error scan of each of said modulation symbols in said codeword;
    marking said modulation symbols that fail to comply with the first predetermined criteria;
    demodulating each of said modulation symbols in said codeword;
    computing a first error syndrome using each of said demodulated symbols; and,
    correcting errors using said first error syndrome computed.

2. The method as set forth in claim 1, further comprising:
    computing a second error syndrome following said correcting step; and
    marking as uncorrectable data where said second error syndrome is non-zero 3. The method as set forth in claim 1, further comprising terminating the error detection and correction process if the number of marked modulation symbols exceeds a second predetermined threshold.

4. The method as set forth in claim 1, wherein said modulating step comprises a seven-to-eight bit modulation.

5. The method as set forth in claim 1, wherein said first predetermined criteria requires said modulation symbol to have no fewer than three binary "1" bits and no fewer than three binary "0" bits.

6. The method as set forth in claim 1, wherein said first predetermined criteria requires said modulation symbol to have no more than five binary "1" bits and no more than five binary "0" bits.

7. The method as set forth in claim 1, wherein the plurality of ECC symbols in said codeword is equal to eleven and the at least one parity symbol is four parity symbols.

8. The method as set forth in claim 1, wherein said first predetermined criteria requires the number of marked modulated symbols to be less than the number of parity symbols divided by two in order for the correcting to be performed.

9. The method as set forth in claim 1, wherein said second error syndrome is computed using a forward error code.

10. The method as set forth in claim 9, wherein said forward error code is a Reed-Solomon (15,11) code.

11. A method for detection and correcting within a plurality of data codewords in which a plurality of data bits are grouped into a plurality of error control coding (ECC) symbols and then the ECC symbols are modulated into a plurality of modulation symbols such that a first predetermined criteria is satisfied for each modulation symbol, the codewords each including a sub-plurality of the modulation symbols and at least one parity symbol, the method comprising:
performing a first modulation error scan of each of said modulation symbols in said codeword;
marking said modulation symbols that fail to comply with the first predetermined criteria, the first predetermined criteria specifying that each modulation symbol includes between x and y binary (1) bits in total and between x and y binary (0) bits in total;
demodulating each of said modulation symbol in said codeword;
computing a first error syndrome using each of said demodulated symbols; and,
correcting errors using said first error syndrome computed, wherein the ECC symbols are modulated into the modulation symbols by:
ordering the ECC symbols in numerical order from a lowest ECC symbol to a highest ECC symbol;
ordering the modulation symbols in numerical order from a lowest modulation symbol to a highest modulation symbol, each modulation symbol satisfying the first predetermined criteria;
setting a current ECC symbol to the lowest ECC symbol and setting a current modulation symbol to the lowest modulation symbol;
as a predefined entry point of the method, assigning the current ECC symbol to the current modulation symbol;
where the current ECC symbol is not the highest ECC symbol,
advancing the current ECC symbol to a next ECC symbol within the numerical order in which the ECC symbols have been ordered;
advancing the current modulation symbol to a next modulation symbol within the numerical order in which the modulation symbols have been ordered;
repeating the method at the predefined entry point.

12. The method of claim 11, wherein the marking includes recording a location within the data codeword of said modulation symbols that fail to comply with the first predetermined criteria.

13. The method of claim 11, wherein the performing includes determining a count of how many of said modulation symbols have fewer than a minimum number or more than a maximum number of data bits having either a logical "1" or a logical "0" value.

14. The method of claim 11, wherein the data codeword is stored on a medium and read therefrom.

15. The method of claim 11, wherein the encoded data is received from a transmission source.

16. A method for modulating data for subsequent demodulation and error detection and correction comprising:
grouping a plurality of data bits into a plurality of error control coding (ECC) symbols;
modulating said ECC symbols into a plurality of modulation symbols such that a predetermined criteria is satisfied for each modulation symbol, the first predetermined criteria specifying that each modulation symbol includes between x and y binary (1) bits in total and between x and y binary (0) bits in total, wherein modulating said ECC symbols into the modulation symbols comprises:
ordering the ECC symbols in numerical order from a lowest ECC symbol to a highest ECC symbol;
ordering the modulation symbols in numerical order from a lowest modulation symbol to a highest modulation symbol, each modulation symbol satisfying the first predetermined criteria;
setting a current ECC symbol to the lowest ECC symbol and setting a current modulation symbol to the lowest modulation symbol;
as a predefined entry point of the method, assigning the current ECC symbol to the current modulation symbol;
where the current ECC symbol is not the highest ECC symbol,
advancing the current ECC symbol to a next ECC symbol within the numerical order in which the ECC symbols have been ordered;
advancing the current modulation symbol to a next modulation symbol within the numerical order in which the modulation symbols have been ordered;
repeating the method at the predefined entry point;
combining a sub-plurality of modulation symbols with at least one parity symbol to form a codeword; and
storing said codeword on a medium such that, upon reading, a first modulation error scan of said modulation symbol enables marking of data that fails to comply with the predetermined criteria and, following demodulation, a first error syndrome is calculated and used to correct errors in the data bits.

17. A computer program product comprising a computer storage medium having program logic stored thereon, wherein said program logic comprises machine readable code executable by a computer, wherein said machine readable code comprises instructions for performing a method comprising:
acquiring a plurality of codewords in which a plurality of data bits are grouped into a plurality of error control coding (ECC) symbols and then modulated into a plurality of modulation symbols such that a first predetermined criteria is satisfied for each modulation symbol, the first predetermined criteria specifying that each modulation symbol includes between x and y binary (1) bits in total and between x and y binary (0) bits in total, each codeword including a sub-plurality of the modulation symbols and at least one parity symbol;
performing a first modulation error scan of each of said modulation symbols in said codeword;
marking said modulation symbols that fail to comply with a first predetermined criteria;
demodulating each of said modulation symbols in said codeword;
computing a first error syndrome using each of said demodulated symbols; and,
correcting errors using said first error syndrome computed, wherein the ECC symbols are modulated into the modulation symbols by:
ordering the ECC symbols in numerical order from a lowest ECC symbol to a highest ECC symbol;
ordering the modulation symbols in numerical order from a lowest modulation symbol to a highest modulation symbol, each modulation symbol satisfying the first predetermined criteria;
setting a current ECC symbol to the lowest ECC symbol and setting a current modulation symbol to the lowest modulation symbol;
as a predefined entry point of the method, assigning the current ECC symbol to the current modulation symbol;
where the current ECC symbol is not the highest ECC symbol,
advancing the current ECC symbol to a next ECC symbol within the numerical order in which the ECC symbols have been ordered;
advancing the current modulation symbol to a next modulation symbol within the numerical order in which the modulation symbols have been ordered;
repeating the method at the predefined entry point.

18. The computer program product as set forth in claim 17, further comprising instructions for:
computing a second error syndrome following said correcting step; and
marking as uncorrectable data where said second error syndrome is non-zero.

19. A system for error correction and detection comprising:
means for grouping a plurality of data bits into a plurality of error control coding (ECC) symbols;
means for modulating said ECC symbols into a plurality of modulation symbols such that a first predetermined criteria is satisfied for each modulation symbol, the first predetermined criteria specifying that each modulation symbol includes between x and y binary (1) bits in total and between x and y binary (0) bits in total, wherein the ECC symbols are modulated into the modulation symbols by performing a method comprising:
ordering the ECC symbols in numerical order from a lowest ECC symbol to a highest ECC symbol;
ordering the modulation symbols in numerical order from a lowest modulation symbol to a highest modulation symbol, each modulation symbol satisfying the first predetermined criteria;
setting a current ECC symbol to the lowest ECC symbol and setting a current modulation symbol to the lowest modulation symbol;
as a predefined entry point of the method, assigning the current ECC symbol to the current modulation symbol;
where the current ECC symbol is not the highest ECC symbol,
advancing the current ECC symbol to a next ECC symbol within the numerical order in which the ECC symbols have been ordered;
advancing the current modulation symbol to a next modulation symbol within the numerical order in which the modulation symbols have been ordered;
repeating the method at the predefined entry point;
means for performing a first modulation error scan of each of said modulation symbols in said codeword;
means for marking said modulation symbols that fail to comply with a first predetermined criteria;
means for demodulating each of said modulation symbols in said codeword;
means for computing a first error syndrome using each of said demodulated symbols; and,
means for correcting errors using said first error syndrome computed.

20. The system as set forth in claim method as set forth in claim 19 further comprising:
means for computing a second error syndrome following said correcting step; and
means for marking as uncorrectable data where said second error syndrome is non-zero.

21. A method of error detection and correction of encoded data having modulation symbols representative of error control coding (ECC) symbols and parity symbols, the encoded data comprising a plurality of codewords, each code word including one or more of the modulation symbols and one or more of the parity symbols, the modulation symbols modulated such that a first predetermined criteria is satisfied for each modulation symbol, the first predetermined criteria specifying that each modulation symbol includes between x and y binary (1) bits in total and between x and y binary (0) bits in total, the method comprising:
demodulating the modulated symbols of the encoded data so as to obtain the ECC symbols;
computing an error syndrome based on the ECC symbols;
if the error syndrome indicates the presence of errors after the computing, applying forward error correction to the ECC symbols and recomputing the error syndrome; and
signaling a decoding success if the error syndrome indicates the absence of errors after the computing or after the recomputing,
wherein the ECC symbols are modulated into the modulation symbols by:
ordering the ECC symbols in numerical order from a lowest ECC symbol to a highest ECC symbol;
ordering the modulation symbols in numerical order from a lowest modulation symbol to a highest modulation symbol, each modulation symbol satisfying the first predetermined criteria;
setting a current ECC symbol to the lowest ECC symbol and setting a current modulation symbol to the lowest modulation symbol;
as a predefined entry point of the method, assigning the current ECC symbol to the current modulation symbol;
where the current ECC symbol is not the highest ECC symbol,
advancing the current ECC symbol to a next ECC symbol within the numerical order in which the ECC symbols have been ordered;
advancing the current modulation symbol to a next modulation symbol within the numerical order in which the modulation symbols have been ordered;
repeating the method at the predefined entry point.

22. The method of claim 21, comprising:
signaling a decoding failure if the error syndrome indicates the presence of errors after the recomputing.

23. The method of claim 21, wherein the demodulating further detects a number of demodulation errors, comprising:
signaling a decoding failure if the number of demodulation errors exceeds a threshold.

24. The method of claim 23, wherein the threshold is equal to the number of parity symbols divided by two.

25. An error detection and correction system for processing a plurality of data codewords in which a plurality of data bits are grouped into a plurality of error control coding (ECC) symbols and then modulated into a plurality of modulation symbols such that a first predetermined criteria is satisfied for each modulation symbol, the first predetermined criteria specifying that each modulation symbol includes between x and y binary (1)bits in total and between x and y binary (0) bits in total, each codeword including a sub-plurality of the modulation symbols and at least one parity symbol, the system comprising:

a demodulation error detector configured to perform a first modulation error scan of each of said modulation symbols in said codeword, mark said modulation symbols that fail to comply with a first predetermined criteria, and demodulate the modulated symbols of the encoded data so as to obtain the ECC symbols; and a forward error detector and corrector coupled to the demodulation error detector and configured to receive the ECC symbols, the forward error detector and corrector further configured to compute a first error syndrome using each of said demodulated symbols, and correct errors using said first error syndrome computed, wherein the ECC symbols are modulated into the modulation symbols by performing a method comprising:

ordering the ECC symbols in numerical order from a lowest ECC symbol to a highest ECC symbol;

ordering the modulation symbols in numerical order from a lowest modulation symbol to a highest modulation symbol, each modulation symbol satisfying the first predetermined criteria;

setting a current ECC symbol to the lowest ECC symbol and setting a current modulation symbol to the lowest modulation symbol;

as a predefined entry point of the method, assigning the current ECC symbol to the current modulation symbol;

where the current ECC symbol is not the highest ECC symbol, advancing the current ECC symbol to a next ECC symbol within the numerical order in which the ECC symbols have been ordered;

advancing the current modulation symbol to a next modulation symbol within the numerical order in which the modulation symbols have been ordered;

repeating the method at the predefined entry point.

26. The system of claim 25, wherein the demodulation detector is further configured to detect a number of demodulation errors, and signal a decoding failure if the number of demodulation errors exceeds a threshold.

27. The system of claim 26, wherein the threshold is equal to the number of parity symbols contained in the codeword divided by two.

28. A computer program product comprising a computer storage medium having program logic stored thereon, wherein said program logic comprises machine readable code executable by a computer, wherein said machine readable code comprises instructions for performing a method comprising:

grouping a plurality of data bits into a plurality of error control coding (ECC) symbols;

modulating said ECC symbols into a plurality of modulation symbols such that a first predetermined criteria is satisfied for each modulation symbol, the first predetermined criteria specifying that each modulation symbol includes between x and y binary (1) bits in total and between x and y binary (0) bits in total, wherein the ECC symbols are modulated into the modulation symbols by:

ordering the ECC symbols in numerical order from a lowest ECC symbol to a highest ECC symbol;

ordering the modulation symbols in numerical order from a lowest modulation symbol to a highest modulation symbol, each modulation symbol satisfying the first predetermined criteria;

setting a current ECC symbol to the lowest ECC symbol and setting a current modulation symbol to the lowest modulation symbol;

as a predefined entry point of the method, assigning the current ECC symbol to the current modulation symbol;

where the current ECC symbol is not the highest ECC symbol, advancing the current ECC symbol to a next ECC symbol within the numerical order in which the ECC symbols have been ordered;

advancing the current modulation symbol to a next modulation symbol within the numerical order in which the modulation symbols have been ordered;

repeating the method at the predefined entry point, and storing said modulation symbol on a medium such that, upon reading, a first modulation error scan of said modulation symbol enables marking of data that fails to comply with a predetermined criteria and, following demodulation, a first error syndrome is calculated and used to correct errors in the data bits.

* * * * *

UNITED STATES PATENT AND TRADEMARK OFFICE
CERTIFICATE OF CORRECTION

PATENT NO. : 7,404,133 B2 Page 1 of 1
APPLICATION NO. : 11/013573
DATED : July 22, 2008
INVENTOR(S) : Paul J. McClellan et al.

It is certified that error appears in the above-identified patent and that said Letters Patent is hereby corrected as shown below:

In column 6, line 13, in Claim 1, delete "binary (1)" and insert -- binary (0) --, therefor.

In column 6, line 53, in Claim 2, after "non-zero" insert -- . --.

In column 8, line 6, in Claim 16, after "symbols" insert -- , --.

In column 10, line 5, in Claim 20, after "system" delete "as set forth in claim method".

Signed and Sealed this

Eighteenth Day of August, 2009

David J. Kappos
*Director of the United States Patent and Trademark Office*